US 8,564,996 B2

(12) United States Patent
Masuzawa et al.

(10) Patent No.: US 8,564,996 B2
(45) Date of Patent: Oct. 22, 2013

(54) SEMICONDUCTOR MODULE AND DRIVING APPARATUS INCLUDING SEMICONDUCTOR MODULE

(75) Inventors: Takashi Masuzawa, Anjo (JP); Toshihiro Fujita, Obu (JP); Hiroshi Taki, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 13/483,244

(22) Filed: May 30, 2012

(65) Prior Publication Data

US 2012/0306299 A1 Dec. 6, 2012

(30) Foreign Application Priority Data

May 30, 2011 (JP) ................................ 2011-120273

(51) Int. Cl.
*H02M 7/5387* (2007.01)
*H02M 3/24* (2006.01)
*H02M 7/44* (2006.01)
*H02M 7/537* (2006.01)
*H02M 1/00* (2007.01)

(52) U.S. Cl.
USPC ................ 363/132; 363/95; 363/97; 363/98; 363/131; 363/144

(58) Field of Classification Search
USPC ........ 363/95, 97, 98, 131, 132, 144; 361/622, 361/625, 679.01, 728
See application file for complete search history.

(56) References Cited

U.S. PATENT DOCUMENTS

| 6,525,950 | B1 | 2/2003 | Shirakawa et al. |
| 7,589,481 | B2 * | 9/2009 | Sonoda et al. .................. 318/34 |
| 7,999,425 | B2 * | 8/2011 | Utsumi et al. .............. 310/68 D |
| 8,299,664 | B2 * | 10/2012 | Iwai et al. ........................ 310/64 |
| 8,304,942 | B2 * | 11/2012 | Yamasaki et al. ............... 310/64 |
| 8,310,121 | B2 * | 11/2012 | Fujita et al. ..................... 310/71 |
| 8,395,338 | B2 * | 3/2013 | Kuroda et al. ........... 318/400.11 |
| 2002/0060105 | A1 * | 5/2002 | Tominaga et al. ............ 180/443 |
| 2010/0327709 | A1 * | 12/2010 | Minato et al. ............... 310/68 D |
| 2011/0018374 | A1 * | 1/2011 | Yamasaki et al. ............... 310/64 |
| 2011/0254388 | A1 * | 10/2011 | Yamasaki ........................ 310/43 |
| 2011/0285226 | A1 * | 11/2011 | Fujita et al. ..................... 310/71 |
| 2011/0285336 | A1 * | 11/2011 | Fujita et al. .............. 318/400.27 |
| 2012/0306328 | A1 * | 12/2012 | Fujita .......................... 310/68 D |

OTHER PUBLICATIONS

U.S. Appl. No. 13/483,223 of Fujita, filed May 30, 2012.

* cited by examiner

*Primary Examiner* — Timothy J Dole
*Assistant Examiner* — Yusef Ahmed
(74) *Attorney, Agent, or Firm* — Nixon & Vanderhye P.C.

(57) ABSTRACT

In a semiconductor module, a high-potential side conductor includes a wide section on which the high-potential side switching element is mounted, a high-potential side terminal coupled with a high potential source, and a narrow section extending from the wide section to the high-potential side terminal in a first direction. The wide section is wider than the narrow section in a second direction perpendicular to the first direction. The wide section has a first side and a second side opposite to the first side in the second direction. A distance between the first side of the wide section and a low-potential side conductor is shorter than a distance between the second side of the wide section and the low-potential side conductor. The narrow section extends from a portion of the wide section closer to the first side than the second side.

10 Claims, 7 Drawing Sheets

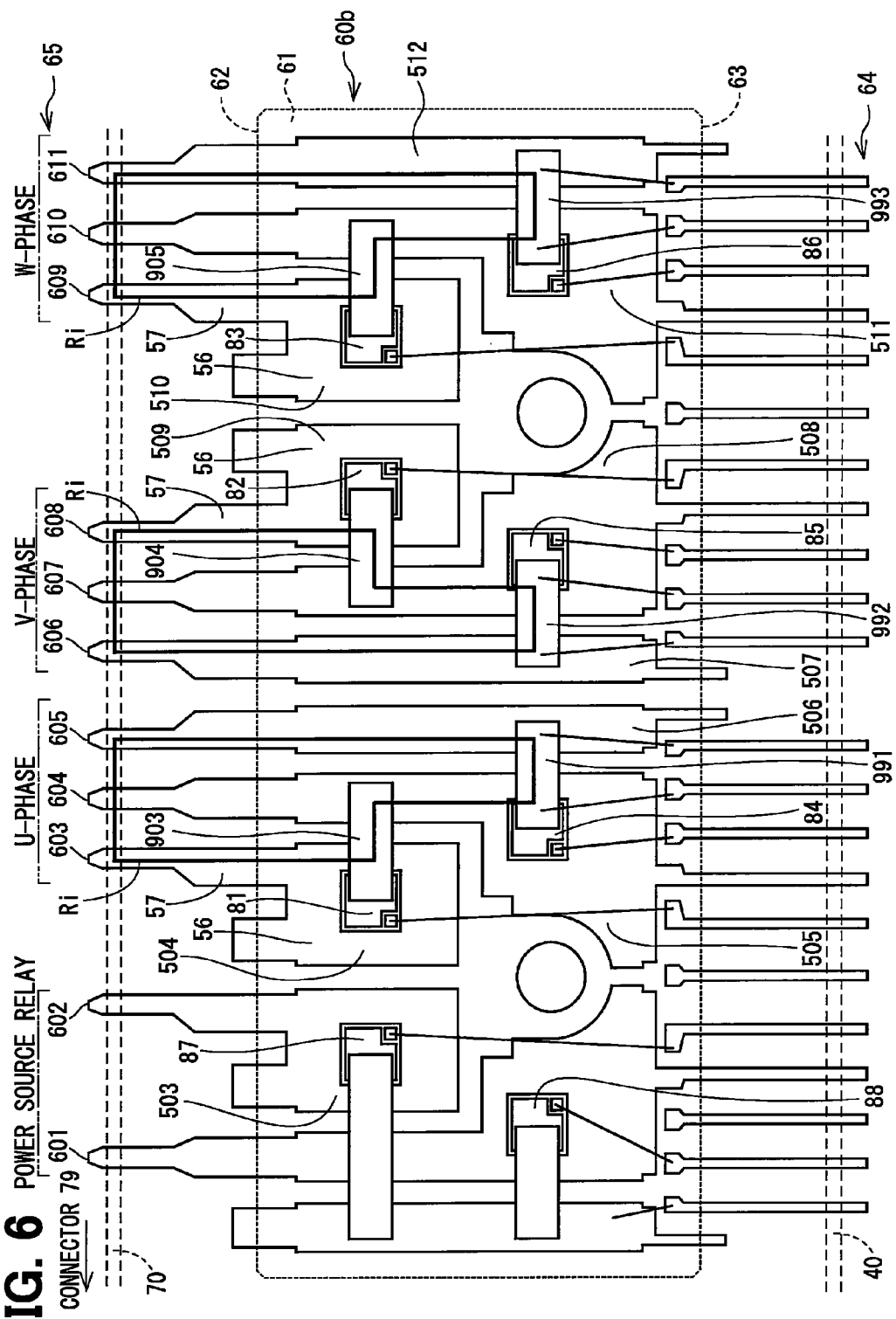

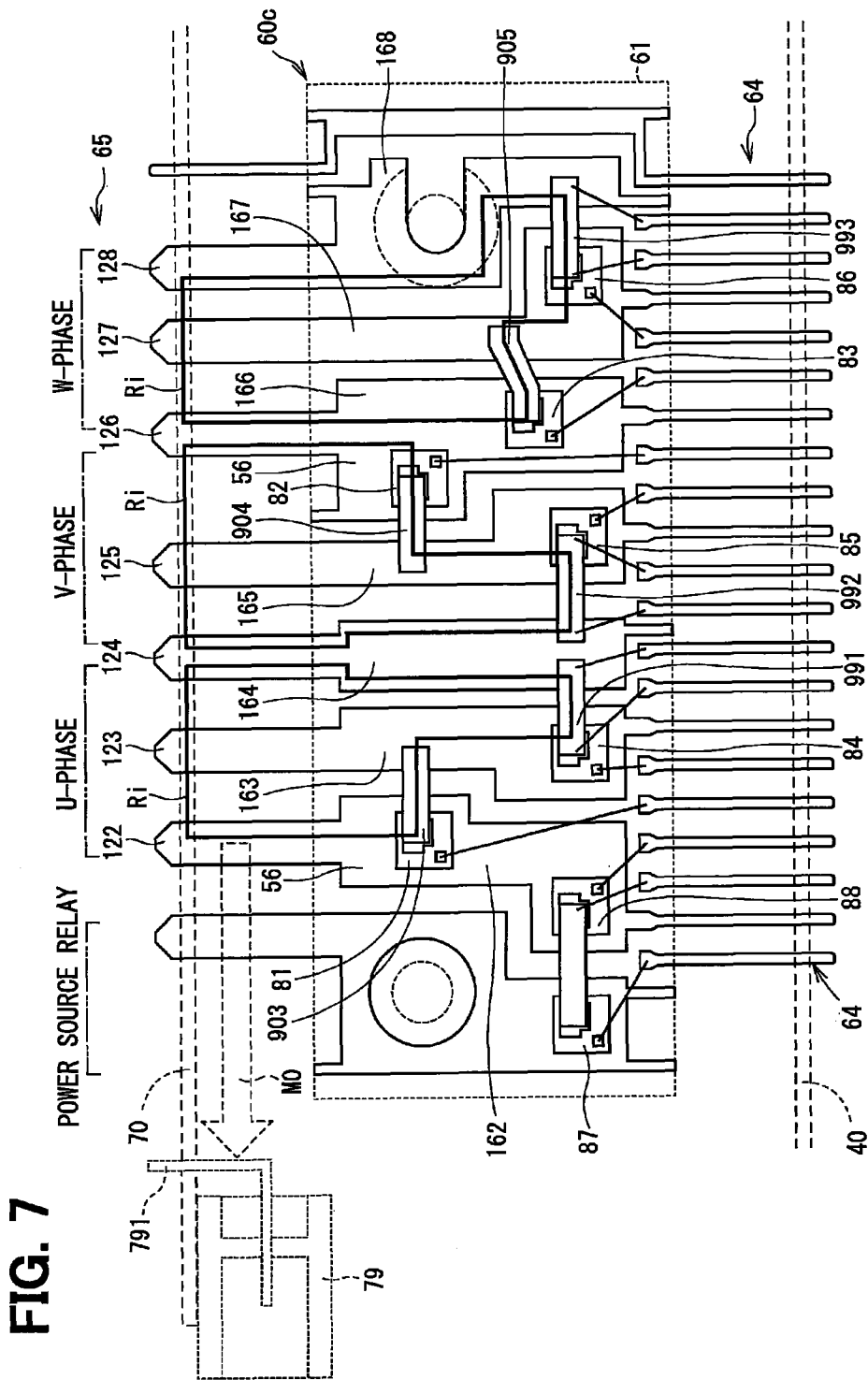

SEMICONDUCTOR MODULE AND DRIVING APPARATUS INCLUDING SEMICONDUCTOR MODULE

CROSS REFERENCE TO RELATED APPLICATIONS

The present application is based on and claims priority to Japanese Patent Application No. 2011-120273 filed on May 30, 2011, the contents of which are incorporated in their entirety herein by reference.

TECHNICAL FIELD

The present disclosure relates to a semiconductor module and a driving apparatus including a semiconductor module.

BACKGROUND

A conventional inverter device produces alternating current power from direct current power by switching an on-off state of a semiconductor device such as a transistor. For example, Japanese Patent No. 3,633,432 (corresponding to U.S. Pat. No. 6,525,950) discloses a semiconductor device in which a semiconductor element producing three-phase alternating current power, a positive direct current terminal, a negative direct current terminal, and an output terminal and the like are integrated.

SUMMARY

It is an object of the present disclosure to provide a semiconductor module that can restrict a generation of a radiation magnetic field by a high frequency current that flows due to a switching operation of a switching element. Another object of the present disclosure is to provide a driving apparatus including the semiconductor module.

According to a first aspect of the present disclosure, a semiconductor module includes a plurality of switching elements, a high-potential side conductor, a load side conductor, a low-potential side conductor, a first connection conductor, a second connection conductor, and a molded member. The switching elements form an inverter converting a direct current to an alternating current. The switching elements include a high-potential side switching element and a low-potential side switching element. The high-potential side switching element is coupled to a higher potential side than the low-potential side switching element. The high-potential side switching element is mounted on the high-potential side conductor. The high-potential side conductor extends in a first direction and includes a high-potential side terminal coupled with a high potential source. The high-potential side conductor is coupled with a drain or a drain equivalent electrode of the high-potential side switching element. The low-potential side switching element is mounted on the load side conductor. The load side conductor includes a load side terminal coupled with a load. The load side conductor is coupled with a drain or a drain equivalent electrode of the low-potential side switching element. The low-potential side conductor extends in the first direction and includes a low-potential side terminal coupled with a low potential source. The first connection conductor couples a source or a source equivalent electrode of the high-potential side switching element and the load side conductor. The second connection conductor couples a source or a source equivalent electrode of the low-potential side switching element and the low-potential side conductor. The molded member integrally covers the high-potential side switching element, the low-potential side switching element, the high-potential side conductor, the load side conductor, the low-potential side conductor, the first connection conductor, and the second connection conductor. The high-potential side conductor further includes a wide section on which the high-potential side switching element is mounted and a narrow section extending from the wide section to the high-potential side terminal in the first direction. The wide section is wider than the narrow section in a second direction perpendicular to the first direction. The wide section has a first side and a second side opposite to the first side in the second direction. A distance between the first side of the wide section and the low-potential side conductor is shorter than a distance between the second side of the wide section and the low-potential side conductor. The narrow section extends from a portion of the wide section closer to the first side than the second side.

In the semiconductor module, a distance of a current pathway from the high-potential side terminal to the low-potential side terminal can be short, and a loop area of a high frequency current can be small. Thus, the semiconductor module can restrict a generation of a radiation magnetic field by a high frequency current that flows due to switching operations of the switching elements.

According to a second aspect of the present disclosure, a driving apparatus includes a motor and a control unit disposed on a side of the motor in an axial direction of the motor. The motor includes a winding. The control unit includes the semiconductor module according to the first aspect, a heat sink, and a substrate. The semiconductor module is electrically coupled with the winding as the load and is mounted on the heat sink. The heat sink receives heat generated in the semiconductor module. The substrate is electrically coupled with the semiconductor module.

The driving apparatus including the power module can restrict a generation of a radiation magnetic field.

BRIEF DESCRIPTION OF THE DRAWINGS

Additional objects and advantages of the present disclosure will be more readily apparent from the following detailed description when taken together with the accompanying drawings. In the drawings:

FIG. 6 is a diagram showing an internal configuration and current pathways of a power module according to a second embodiment of the present disclosure; and FIG. 7 is a diagram showing an internal configuration and current pathways of a power module according to a comparative example.

DETAILED DESCRIPTION

The inventors of the present disclosure found the following. In a semiconductor device disclosed in Japanese Patent No. 3,633,432, an inductance is reduced by parallelizing current pathways with a positive direct current terminal and a negative direct current terminal. However, the semiconductor device is not designed in view of a radiation magnetic field generated by a high frequency current that flows due to a switching operation of a semiconductor switch. In the positive direct current terminal and the negative direct current terminal, a width of a terminal portion is substantially equal to a width of a mounted portion on which the semiconductor substrate is mounted. In the above-described configuration, when the semiconductor device is designed for a high current, the widths of the terminal portion and the mounted portion are increased similarly. Thus, a distance of a current pathway from the positive direct current terminal to the negative direct current terminal increases, and a radiation magnetic field generated by the current may increase depending on a frequency. When the radiation magnetic field is generated, a magnetic coupling may be generated between electronic components, such as a connector, a conductive member (e.g., a bus bar), a coil, and a capacitor, coupled with a substrate to which the semiconductor module is coupled.

Figure 1:
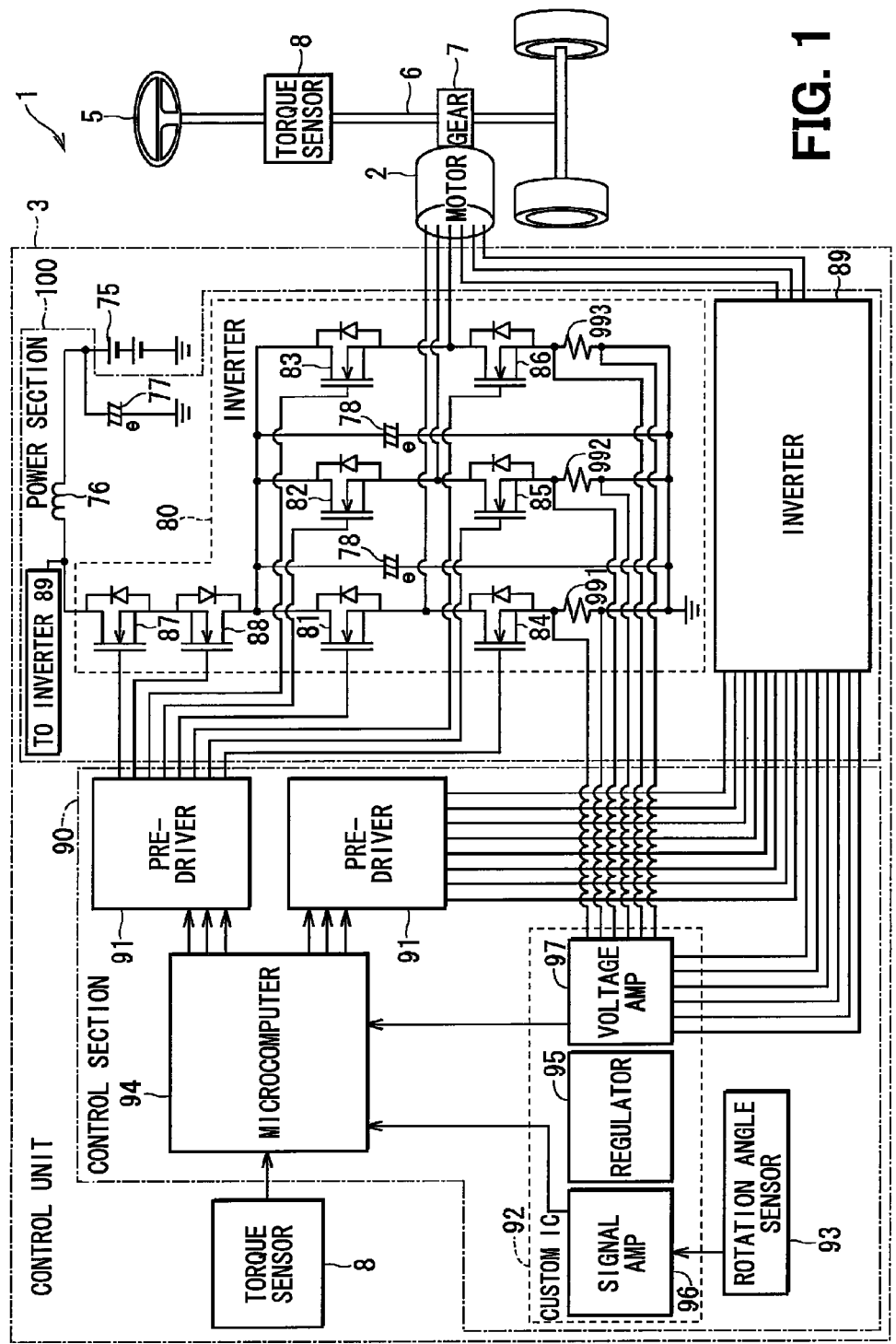
FIG. 1 is a block diagram showing a power steering apparatus according to a first embodiment of the present disclosure.

In view of the foregoing, embodiments of the present disclosure will be described below First Embodiment A driving apparatus 1 including a semiconductor module according to a first embodiment of the present disclosure will be described with reference to FIG. 1 and FIG. 2. The driving apparatus 1 can be applied to an electric power steering apparatus (hereafter, referred to as EPS) that assists a steering operation of a vehicle. The driving apparatus 1 includes a motor 2 and a control unit 3.

An electric configuration of the EPS will be described with reference to FIG. 1. As shown in FIG. 1, the driving apparatus 1 generates a rotation torque at a column shaft 6, which is a rotation axis of a steering wheel 5 of a vehicle, via a gear 7 attached to the column shaft 6 and assists a steering operation with the steering wheel 5. When a driver operates the steering wheel 5, a steering torque generated at the column shaft 6 by the operation is detected with a torque sensor 8. In addition, the driving apparatus 1 receives vehicle information from a controller area network (CAN), which is not shown, to assist the steering operation of the steering wheel 5 by the driver. By using the above-described configuration, the driving apparatus 1 can automatically control the operation of the steering wheel 5 to keep lane in a highway or to guide to a parking space in a parking lot.

The motor 2 is a three-phase brushless motor that rotates the gear 7 forward and reverse. The control unit 3 controls current supply and drive of the motor 2. The control unit 3 includes a power section 100 and a control section 90. The power section 100 is applied with a driving current to drive the motor 2. The control section 90 controls the drive of the motor 2.

The power section 100 includes a choke coil 76, a capacitor 77, and inverters 80, 89. The choke coil 76 is disposed on a power source line from a power source 75. Because the inverter 80 and the inverter 89 have similar configurations, only the configuration of the inverter 80 will be described below. The inverter 80 includes metal-oxide-semiconductor field-effect transistors (MOSFETs) 81-86, which are a kind of field-effect transistor. An on-off state of each of the MOSFETs 81-86 is controlled with a gate potential. In other words, a source and a drain of each of the MOSFETs 81-86 are connected or disconnected by controlling the gate potential.

The drain of the MOSFET 81 is coupled with the power source line and the source of the MOSFET 81 is coupled with the drain of the MOSFET 84. The source of the MOSFET 84 is coupled with the ground via a shunt resistor 991. A junction point of the MOSFET 81 and the MOSFET 84 is coupled with a U-phase winding of the motor 2. The drain of the MOSFET 82 is coupled with the power source line and the source of the MOSFET 82 is coupled with the drain of the MOSFET 85. The source of the MOSFET 85 is coupled with the ground via a shunt resistor 992. A junction point of the MOSFET 82 and the MOSFET 85 is coupled with a V-phase winding of the motor 2. The drain of the MOSFET 83 is coupled with the power source line and the source of the MOSFET 83 is coupled with the drain of the MOSFET 86. The source of the MOSFET 86 is coupled with the ground via a shunt resistor 993. A junction point of the MOSFET 83 and the MOSFET 86 is coupled with a W-phase winding of the motor 2. The MOSFETs 81-83 coupled to a higher potential side than the MOSFETs 84-86 are also called "higher MOSFETs." The MOSFETs 84-86 coupled to a lower potential side are also called "lower MOSFETs." Each of the higher MOSFETs 81-83 can operate as a high-potential side switching element. Each of the lower MOSFETs 84-86 can operate as a low-potential side switching element.

The inverter 80 further includes MOSFETs 87, 88 for a power source relay. The MOSFETs 87, 88 may have structures similar to the MOSFETs 81-86. The MOSFETs 87, 88 are coupled between the higher MOSFETs 81-83 and the power source 75 and are capable of interrupting electric current in an abnormal state. The MOSFET 87 interrupts a current flow to the motor 2 when a breaking fault or a short fault occurs. The MOSFET 88 can operate as a reverse coupling protection so that a reverse current does not flow when an electronic component, such as the capacitor 78, is coupled in the reverse direction.

The shunt resistors 991-993 are electrically coupled between the lower MOSFETs 84-86 and the ground, respectively. The driving apparatus 1 detects electric current that flows to the U-phase winding, the V-phase winding, and the W-phase winding by detecting voltage or electric current applied to the shunt resistors 991-993, respectively.

The choke coil 76 and the capacitor 77 are electrically coupled between the power source 75 and the MOSFET 87 for the power source relay. The choke coil 76 and the capacitor 77 form a filter circuit to reduce noises transmitted from a different device coupled with the power source 75. In addition, the choke coil 76 and the capacitor 77 reduce noises transmitted from the driving apparatus 1 to the different device coupled with the power source 75.

The capacitor 78 is electrically coupled between the power source 75 and the ground in parallel with the higher MOSFET, the lower MOSFET, and the shunt resistor. The capacitor 78 stores electric charge to support power supply to the MOSFETs 81-86 and to reduce a noise component in a surge voltage. The capacitors 77, 78 of the present embodiment may be aluminum electrolytic capacitors. The capacitor 78 has a larger capacity than the capacitor 77. The capacitors 77, 78 may also be capacitors other than aluminum electrolytic capacitors.

The control section 90 includes pre-drivers 91, a custom integrated circuit (custom IC) 92, a rotation angle sensor 93, and a microcomputer 94. The custom IC 92 includes a regulator portion (REGULATOR) 95, a signal amplification portion (SIGNAL AMP) 96, and a voltage amplification portion (VOLTAGE AMP) 97 as functional blocks. The regulator portion 95 is a stabilizing circuit that stabilizes electric power supplied to each component. For example, the microcomputer 94 can operate at a stable predetermined voltage (e.g., 5V) due to the regulator portion 95. The signal amplification portion 96 receives a signal from the rotation angle sensor 93. The rotation angle sensor 93 detects a rotational position signal of the motor 2, and the detected rotational position signal is transmitted to the signal amplification portion 96. The signal amplification portion 96 amplifies the rotational position signal and transmits the amplified signal to the microcomputer 94. The voltage amplification portion 96 detects a voltage between both ends of each of the shunt resistors 991-993, amplifies the voltage, and transmits the amplified voltage to the microcomputer 94.

The microcomputer 94 receives the rotational position signal of the motor 2 and the voltage of both ends of each of the shunt resistors 991-993 via the signal amplification portion 96 and the voltage amplification portion 97. The microcomputer 94 further receives a steering torque signal from the torque sensor 8 attached to the column shaft 6. Furthermore, the microcomputer 94 receives the vehicle information via the CAN. When the microcomputer 94 receives the steering torque signal and the vehicle information, the microcomputer 94 controls the inverter 80 via the pre-driver 91 in accordance with the rotational position signal so as to assist the steering operation with the steering wheel 5 in accordance with a vehicle speed. The microcomputer 94 controls the inverter 80 by changing the gate voltages of the MOSFETs 81-86 via the pre-driver 91, thereby switching the on-off states of the MOSFETs 81-86. Furthermore, the microcomputer 94 controls the inverter 80 so that the electric current supplied to the motor 2 becomes closer to a sine wave based on the voltage between both ends of each of the shunt resistors 991-993 transmitted from the voltage amplification portion 97. The control section 90 also controls the inverter 89 in a manner similar to the inverter 80.

Figure 2:
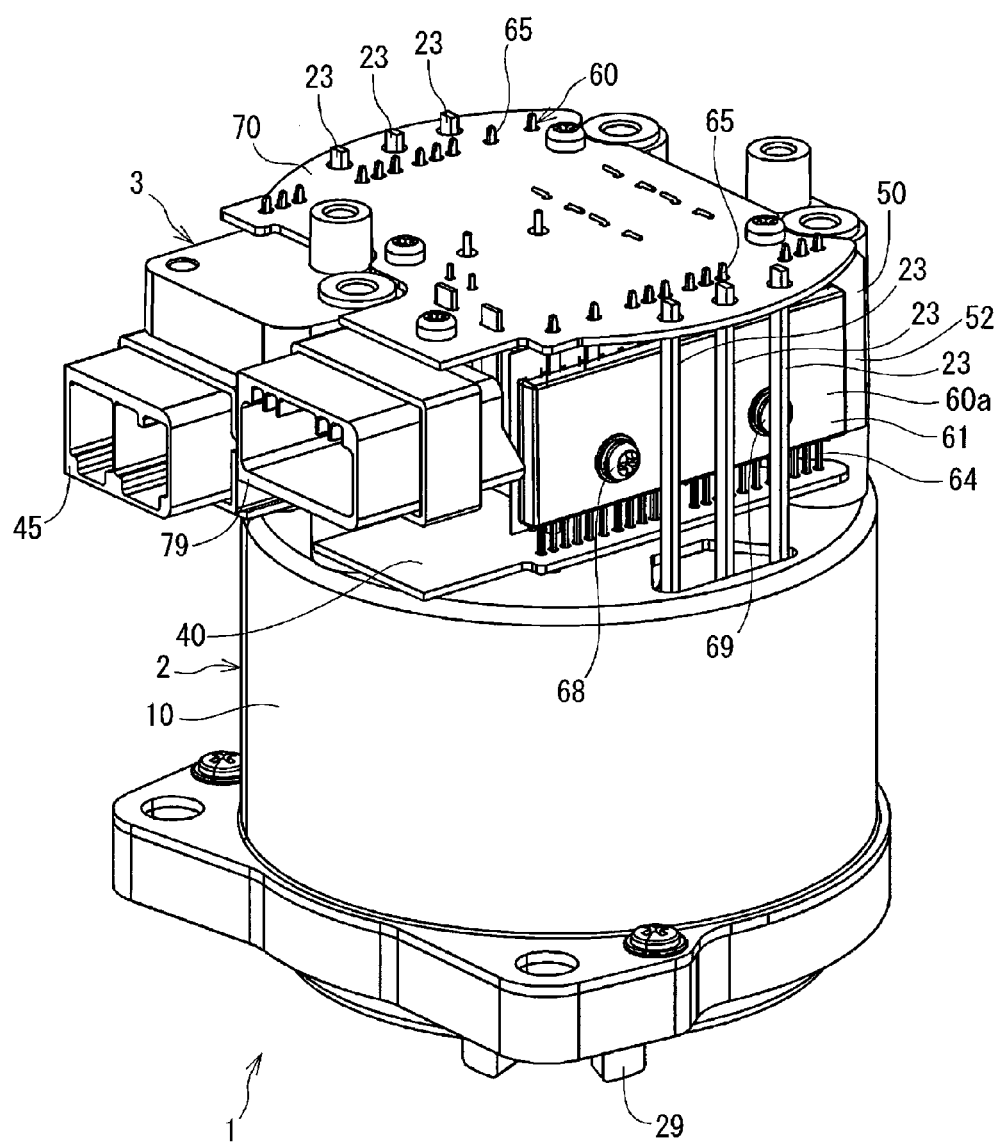
FIG. 2 is a perspective view of a driving apparatus according the first embodiment.

As shown in FIG. 2, the driving apparatus 1 includes the motor 2 and the control unit 3. In the driving apparatus 1 of the present embodiment, the control unit 3 is disposed on one side in an axial direction of the motor 2. The motor 2 and the control unit 3 form a stacking structure. In FIG. 2, a cover that defines a contour of the control unit 3 is removed.

The motor 2 is the three-phase brushless motor. A contour of the motor 2 is defined by a motor case 10. The motor case 10 has a cylindrical shape and is made of, for example, iron. In the motor case 10, a stator, a rotor, a shaft and the like are disposed. When a winding wound to the stator is subject to a rotating magnetic field, the rotor and the shaft rotate integrally. The winding wound to the stator is the three-phase winding including the U-phase winding, the V-phase winding, and the W-phase winding.

Extraction lines 23 are pulled out from six positions in the winding. Three extraction lines 23 are pulled out from a first hole of the motor case 10 toward the control unit 3, and the other three extraction lines 23 are pulled out from a second hole of the motor case 10 toward the control unit 3. The extraction lines 23 extend to a power substrate 70 through a region located radially outside a control substrate 40 and power modules 60a. The three extraction lines 23 pulled out from the first hole correspond to the U-phase winding, the V-phase winding, and the W-phase winding, respectively. The three extraction lines 23 pulled out from the second hole correspond to the U-phase winding, the V-phase winding, and the W-phase winding, respectively.

On an opposite side of the shaft from the control unit 3, an output terminal 29 is disposed. In addition, on the opposite side of the shaft from the control unit 3, a gear box (not shown) is disposed. In the gear box, the gear 7 shown in FIG. 1 is disposed. The gear 7 is coupled with the output terminal 29 and is rotated by a driving force of the motor 2.

The control unit 3 includes the power modules 60a as semiconductor modules, a heat sink 50, the control substrate 40 and the power substrate 70 as substrates. Most components of the control unit 3 except for power connectors 79 coupled with external electronic parts are disposed in a motor case region that is defined by projecting the motor case 10 in the axial direction. In the control unit 3, the control substrate 40, the heat sink 50, the power modules 60a, and the power substrate 70 are disposed in this order from a side adjacent to the motor 2 in the axial direction. In other words, in the axial direction, the motor case 10, the control substrate 40, the heat sink 50, the power modules 60a, and the power substrate 70 are arranged in this order.

The control substrate 40 may be a four-layer substrate made of glass epoxy substrate. The control substrate 40 has a plate shape which can be disposed within the motor case region. The control substrate 40 is fixed to the heat sink 50 by screwing. On the control substrate 40, electronic parts for forming the control section 90 are mounted. On a surface of the control substrate 40 opposite from the motor 2, the pre-drivers 91, the custom IC 92, and the microcomputer 94 are mounted. On a surface of the control substrate 40 facing the motor 2, the rotation angle sensor 93 is mounted.

The control substrate 40 defines through holes for coupling with the control terminals 64 of the power module 60a along an outer edge thereof. In addition, the control substrate 40 is coupled with a control connector 45. The control connector 45 is configured so that a wire can be coupled from radially outside the motor 2 and the signals from the torque sensor 8 and the CAN are input.

The heat sink 50 is made of material having a high thermal conductivity, such as aluminum. The heat sink 50 includes two heat receiving portions 52 having broad surfaces to which the power modules 60a are fixed. The heat receiving portions 52 are disposed in a direction approximately perpendicular to the motor case 10. Along the two heat receiving portions 52 disposed in parallel with each other, two power modules 60a are disposed. The power modules 60a are respectively fixed to the heat receiving portions 52 with screws 68, 69.

Each of the power modules 60a includes a molded member 61 having an approximately rectangular parallel-piped shape, power terminals 65 protruding upward from the molded member 61, and the control terminals 64 protruding downward from the molded member 61. Hereafter, a surface of the molded member 61 from which the power terminals 65 protrude is referred to as a first surface 62, and a surface of the molded member 61 from which the control terminals 64 protrude is referred to as a second surface 63. The power modules 60a are disposed between the control substrate 40 and the power substrate 70 in the axial direction. The power modules 60a are vertically disposed outside the heat sink 50 in the radial direction of the motor 2. Two power modules 60a are disposed on opposite sides of an extended center line of rotation of the motor 2.

One of the power modules 60a corresponds to the inverter 80 and includes the MOSFETs 81-88, and the shunt resistors 991-993. In the present embodiment, the MOSFETs 81-88, and the shunt resistors 991-993 are integrally molded with resin as one power module. The other power module 60a corresponds to the inverter 89 and includes MOSFETs, power relays, and shunt resistors integrally sealed by resin molding. With respect to the one heat receiving portion 52, one power module 60a for forming one driving system is disposed.

The power substrate 70 may be a four-layer substrate made of a glass epoxy substrate and a pattern copper layer. The power substrate 70 has a plate shape disposed within the motor case region and is fixed to the heat sink 50 by screwing.

On the power substrate 70, a power wiring, to which a winding current supplied to the winding is supplied, is disposed.

The power substrate 70 defines through holes for coupling with the power terminals 65 of the power modules 60a. The power substrate 70 further defines through holes for coupling with the extraction lines 23 outside the through holes to which the power terminals 65 are inserted. The power terminals 65 and the extraction lines 23 inserted into the through holes are electrically coupled with the power substrate 70. Accordingly, the extraction lines 23 are coupled with the power module 60a via the power substrate 70.

On a surface of the power substrate 70 facing the motor 2, the choke coil 76 and the capacitors 77, 78 are mounted. The choke coil 76 and the capacitors 77, 78 are disposed in a space defined in the heat sink 50. The choke coil 76, the capacitors 77, 78, and the power connector 79 are disposed between the power substrate 70 and the circuit substrate 40 in the axial direction.

The power substrate 70 is coupled with the power connector 79. The power connector 79 is disposed adjacent to the control connector 45, which is coupled with the control substrate 40. The power connector 79 is configured to be coupled with a wiring from radially outside the motor 2 and is coupled with the power source 75, such as a battery. Accordingly, the power substrate 70 is supplied with electric power from the power source 75 via a terminal 791 in the power connector 79. In addition, the electric power from the power source 75 is supplied to the winding of the motor 2 via the power connector 79, the power substrate 70, the power modules 60a and the extraction lines 23.

An operation of the driving apparatus 1 will be described. The microcomputer 94 mounted on the control substrate 40 generates a pulse signal produced by a pulse-width modulation (PWM) control via the pre-drivers 91, based on the signals from the rotation angle sensor 93, the torque sensor 8, the shunt resistors 991-993 and the like so as to assist the steering operation with the steering wheel 5 in accordance with the vehicle speed. The pulse signal is transmitted to the inverters 80, 89 via the control terminals 64 to control the on-off states of the MOSFETs 81-86. Accordingly, each phase of the winding of the motor 2 is supplied with a sine wave current having a different phase and the rotating magnetic field is generated. By receiving the rotating magnetic field, the rotor and the shaft integrally rotate. When the shaft rotates, the driving force is transmitted from the output terminal 29 to the gear 7 of the column shaft 6 to assist the steering operation with the steering wheel 5 by the driver.

Figure 3:
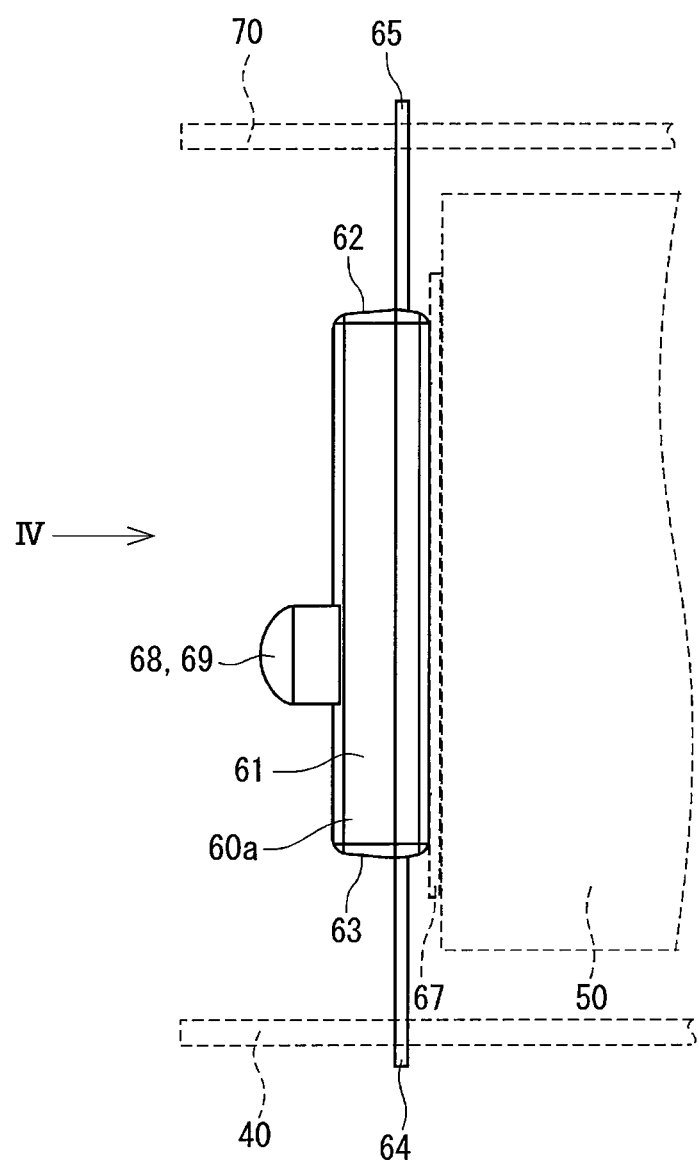
FIG. 3 is a side view of a power module according to the first embodiment.
Figure 4:
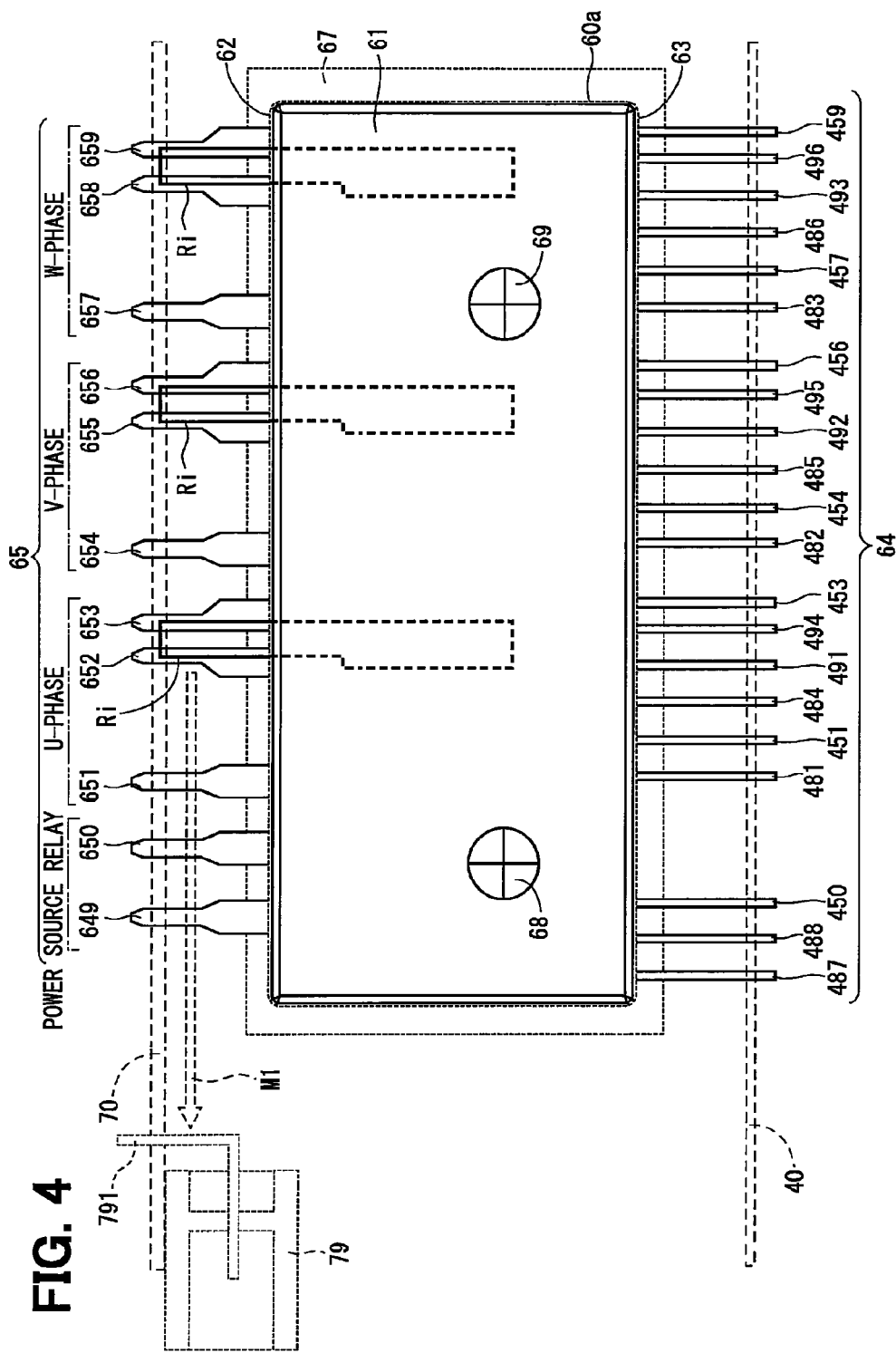
FIG. 4 is a view of the power module seen along arrow IV in FIG. 3.
Figure 5:
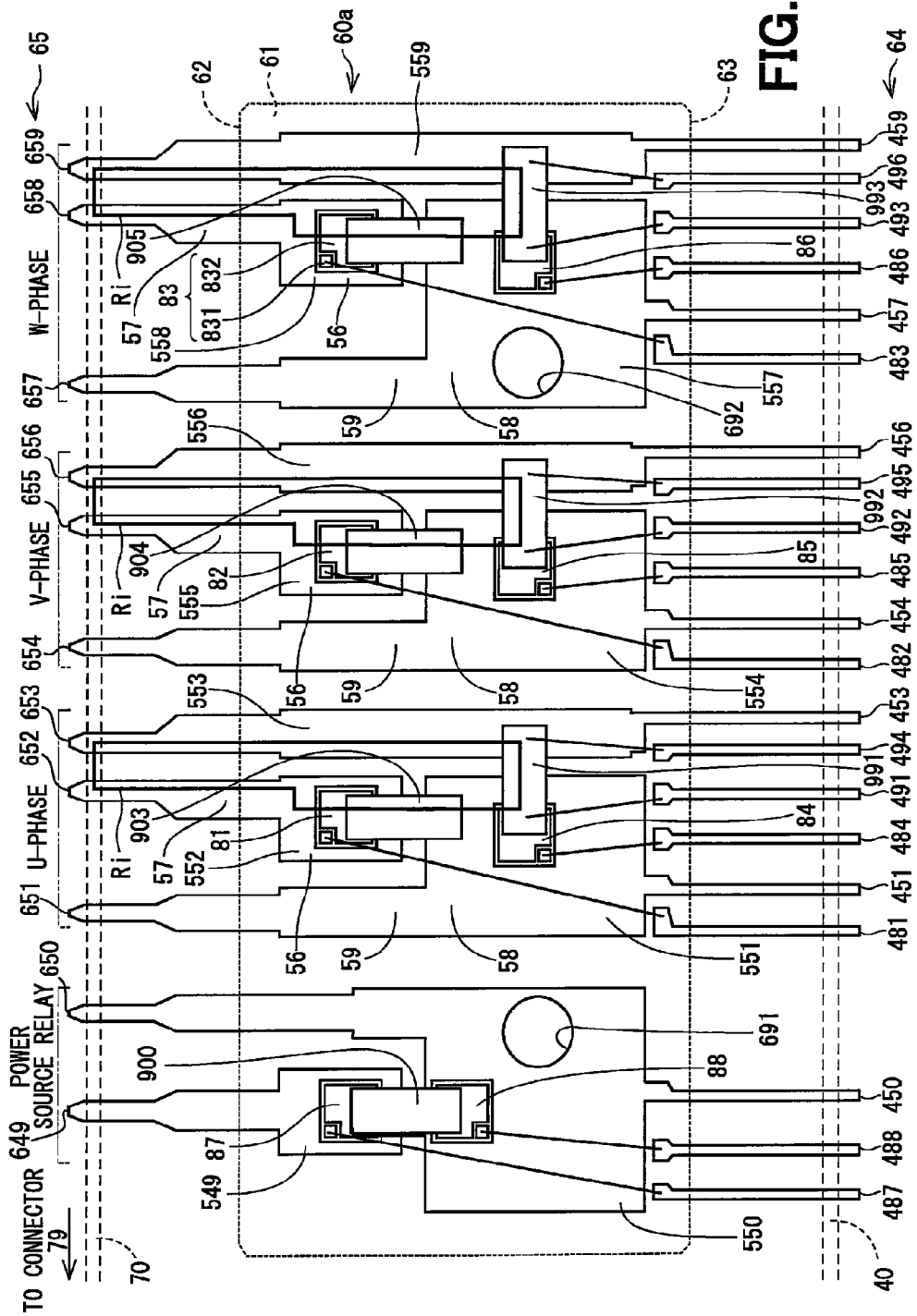
FIG. 5 is a diagram showing an internal configuration and current pathways of the power module according to the first embodiment.

Next, the power modules 60a will be described with reference to FIG. 3 to FIG. 5. Although FIG. 3 to FIG. 5 show a configuration of the power module 60a corresponding to the inverter 80, the power module 60a corresponding to the inverter 89 has a similar configuration. As shown in FIG. 3, a heat radiation sheet 67 is disposed between the power module 60a and the heat sink 50. The power module 60a is fixed to the heat sink 50 by the screws 68, 69 via the heat radiation sheet 67. Accordingly, heat generated by supplying electric current to the power module 60a is radiated to the heat sink 50 via the heat radiation sheet 67. In other words, the heat sink 50 receives heat generated in the semiconductor module 60a. The heat radiation sheet 67 is made of insulation material so as to isolate the power module 60a and the heat sink 50. Furthermore, adhesion between the power module 60a and the heat sink 50 can be increased by disposing the heat radiation sheet 67 between the power module 60a and the heat sink 50.

As shown in FIG. 3 to FIG. 5, the power terminals 65 and the control terminals 64 protrude from the first surface 62 or the second surface 63 of the molded member 61. The power terminals 65 include terminals for the power source relay, terminals for the U-phase winding, terminals for the V-phase winding, and terminals for the W-phase winding from a side close to power connector 79. The control terminals 64 include terminals for the power source relay, terminals for the U-phase winding, terminals for the V-phase winding, and terminals for the W-phase winding from a side close to power connector 79. The power terminals 65 protrude from the first surface 62 of the molded member 61 adjacent to the power substrate 70. The power terminals 65 are inserted into the through holes defined by the power substrate 70 and are electrically coupled with the power substrate 70 with a solder and the like. The power terminals 65 are supplied with the winding current that is supplied to the motor 2 through the power substrate 70 and the extraction lines 23. By switching the on-off states of the MOSFETs 81-88 in the power modules 60a, the winding current is controlled.

The power terminals 65 include a pre-relay terminal 649 and a post-relay terminal 650 as the terminals for the power source relay. The power terminals 65 include a motor terminal 651, a power-source voltage terminal 652, and a ground terminal 653 as the terminals for the U-phase winding. The power terminals 65 include a motor terminal 654, a power-source voltage terminal 655, and a ground terminal 656 as terminals for the V-phase winding. The power terminals 65 include a motor terminal 657, a power-source voltage terminal 658, and a ground terminal 659 as terminals for the W-phase winding. Thus, the power terminals 65 include 11 terminals.

The control terminals 64 protrude from the second surface 63 of the molded member 61 adjacent to the control substrate 40. The control terminals 64 are inserted into the through holes defined by the control substrate 40 and are electrically coupled with the control substrate 40 with solder and the like. The control signal from the control substrate 40 is transmitted to the power module 60a via the control terminals 64. In the present embodiment, only a low current (e.g., 200 mA) at a level of relating to the driving control of the motor 2 flows toward the control substrate 40, and a (high current (e.g., 80 A) for driving the motor 2 flows toward the power substrate 70. Thus, each of the power terminals 65 is larger than each of the control terminals 64.

The control terminals 64 include terminals 450, 487, 488 for the power source relay. The control terminals 64 include terminals 451, 453, 481, 484, 491, 494 for the U-phase winding. The control terminals 64 include terminals 454, 456, 482, 485, 492, 495 for the V-phase winding. The control terminals 64 include terminals 457, 459, 483, 486, 493, 496 for the W-phase winding. Thus, the control terminals 64 include 21 terminals.

Next, an internal configuration of the power module 60a will be described with reference to FIG. 5. As shown in FIG. 5, the power module 60a includes (i) MOSFETs 81-88, (ii) conductors 549, 550 respectively including the pre-relay terminal 649 and the post-relay terminal 650, (iii) motor side conductors 551, 554, 557 respectively including the motor terminals 651, 654, 657, (iv) power-source side conductors 552, 555, 558 respectively including the power-source voltage terminals 652, 655, 658 (v) ground side conductors 553, 556, 559 respectively including the ground terminals 653, 656, 659, (vi) copper clips 900, 903, 904, 905, (vii) the shunt resistors 991, 992, 993, and (viii) the molded member 61.

The motor terminals 651, 654, 657 can operate as load side terminals. The power-source voltage terminals 652, 655, 658 can operate as high-potential side terminals. The ground terminals 653, 656, 659 can operate as low-potential side terminals. The motor side conductors 551, 554, 557 can operate as high-potential side conductors. The power-source side conductors 552, 555, 558 can operate as high-potential side conductors. The ground side conductors 553, 556, 559 can operate as low-potential side conductors. The copper clips 903, 904, 905 couple the sources of the higher MOSFETs 81, 82, 83 and the motor side conductors 551, 554, 557, respectively. The copper clips 903, 904, 905 can operate as first connection conductors. The shunt resistors 991, 992, 993 couple the sources of the lower MOSFETs 84, 85, 86 and the ground side conductors 553, 556, 559, respectively. The shunt resistors 991, 992, 993 can operate as second connection conductors.

The molded member 61 is formed by resin molding to integrally cover the MOSFETs 81-88 and the above-described conductors. On a side of the power module 60a adjacent to the heat sink 50, a part of each conductor 549-559 is exposed from the molded member 61 of the power module 60a as a metal heat radiation portion. In other words, the power module 60a of the present embodiment is a so-called half-molded module. The metal heat radiation portions are in contact with the heat receiving portion 52 of the heat sink 50 via the heat radiation sheet 67, thereby radiating heat efficiently.

The MOSFETs 81-88 are formed of semiconductor chips. For example, as shown in FIG. 5, the gate 831 and the source 832 of the MOSFET 83 is disposed on a front surface of the semiconductor chip. The drain of the MOSFET 83 is formed on a rear surface of the semiconductor chip. The semiconductor chips are mounted on the conductors 549-559. The MOSFETs 81, 82, 84-88 have structures similar to the MOSFET 83.

In the conductors 549-559, wiring patterns are formed of copper or copper alloy plate. The conductors 549-559, the MOSFETs 81-88, the copper clips 900, 903, 904, 905, and the shunt resistors 991, 992, 993 correspond to each terminal block for the power source relay, the U-phase winding, the V-phase winding, and the W-phase winding and are classified roughly into each semiconductor unit for the power source relay, the U-phase winding, the V-phase winding, and the W-phase winding.

The semiconductor unit for the power source relay includes the conductors 549, 550, the MOSFETs 87, 88, and the copper clips 900. The conductor 549 includes the pre-relay terminal 649 protruding from the first surface 62 of the molded member 61. The pre-relay terminal 649 is coupled with the power source 75 via the choke coil 76. The MOSFET 87 for the power source relay is mounted on the conductor 549. The conductor 550 includes the post-relay terminal 650 protruding from the first surface 62 of the molded member 61. The conductor 550 also includes the control terminal 450 for monitoring a voltage after relay. The control terminal 450 protrudes from the second surface 63 of the molded member 61. The post-relay terminal 650 is coupled with each of the power-source voltage terminals 652, 655, 658 via the wiring of the power substrate 70. On the conductor 550, the MOSFET 88 for the reverse coupling protection is mounted. The source of the MOSFET 87 and the source of the MOSFET 88 are coupled each other via the copper clip 900.

The direct current from the power source 75 is supplied to the power-source voltage terminals 652, 655, 658 for the U-phase, the V-phase, and W-phase via the pre-relay terminal 649, the conductor 549, the MOSFET 87, the copper clip 900, the MOSFET 88, the conductor 550, the post-relay terminal 650, and the power substrate 70.

The control terminal 487 disposed adjacent to the second surface 63 is coupled with the MOSFET 87 for the power source relay by wire bonding. The control terminal 488 disposed adjacent to the second surface 63 is coupled with the MOSFET 88 for the power source relay via a bonding wire. When the motor 2 or the control unit 3 is in an abnormal state, the control section 90 changes the gate voltage of the MOSFETs 87, 88 via the control terminals 487, 488 so that the MOSFETs 87, 88 are turned off and the power supply to the inverter 80 is interrupted.

The semiconductor unit for the U-phase winding includes the power-source side conductor 552, the motor side conductor 551, the ground side conductor 553, the higher MOSFET 81, the lower MOSFET 84, the copper clip 903, and the shunt resistor 991. The semiconductor unit for the V-phase winding includes the power-source side conductor 555, the motor side conductor 554, the ground side conductor 556, the higher MOSFET 82, the lower MOSFET 85, the copper clip 904, and the shunt resistor 992. The semiconductor unit for the W-phase winding includes the power-source side conductor 558, the motor side conductor 557, the ground side conductor 559, the higher MOSFET 83, the lower MOSFET 86, the copper clip 905, and the shunt resistor 993. The semiconductor units for the above-described three-phase winding have configurations similar to each other. Thus, the configuration of the semiconductor unit for the U-phase winding will be described below on behalf of the semiconductor units for the three-phase winding.

The power-source side conductor 552 includes the power-source voltage terminal 652 protruding from the first surface 62. The power-source voltage terminal 652 is coupled with the post-relay terminal 650. The power-source side conductor 552 extends in a first direction that is a direction from the control substrate 40 to the power substrate 70. The power-source side conductor 552 includes a first wide section 56 on which the higher MOSFET 81 is mounted and a first narrow section 57 extending from the first wide section 56 to the power-source voltage terminal 652 in the first direction. In a second direction that is perpendicular to the first direction, the first wide section 56 is wider than the first narrow section 57. When the molded member 61 is divided into two regions in the first direction, that is, a region adjacent to the first surface 62 and a region adjacent to the second surface 63, the first wide section 56 is disposed in the region adjacent to the first surface 62. The first wide section 56 has a first side and a second side opposite to the first side in the second direction. A distance between the first side of the first wide section 56 and the ground side conductor 553 is shorter than a distance between the second side of the first wide section 56 and the ground side conductor 553. The first narrow section 57 extends from a portion of the first wide section 56 closer to the first side than the second side. The first narrow section 57 is disposed adjacent to the ground side conductor 553. The source of the higher MOSFET 81 is coupled with the motor side conductor 551 via the copper clip 903.

The motor side conductor 551 extends in the first direction. The motor side conductor 551 includes the motor terminal 651 coupled with the U-phase winding of the motor 2 and the control terminal 451 for monitoring the voltage. The motor terminal 651 protrudes from the first surface 62 and the control terminal 451 protrudes from the second surface 63. The motor side conductor 551 includes a second wide section 58 on which the lower MOSFET 84 is mounted and a second narrow section 59 extending from the second wide section 58 to the motor terminal 651 in the first direction. In the second direction that is perpendicular to the first direction, the second wide section 58 is wider than the second narrow section 59. The second wide section 58 is disposed between the first wide section 56 of the power-source side conductor 552 and the second surface 63. The second wide section 58 is wider than the first wide section 56 in the second direction. The second wide section 58 has a first side and a second side opposite to the first side in the second direction. A distance between the first side of the second wide section 58 and the ground side conductor 553 is shorter than a distance between the second side of the second wide section 58 and the ground side conductor 553. The second narrow section 59 extends from a portion of the second wide section 58 closer to the second side than the first side. The source of the lower MOSFET 84 is coupled with the ground side conductor 553 via the shunt resistor 991.

The ground side conductor 553 has an approximately linear shape extending in the first direction. The ground side conductor 553 includes the ground terminal 653 coupled with the ground and the control terminal 453 for monitoring the voltage. The ground terminal 653 protrudes from the first surface 62 and the control terminal 453 protrudes from the second surface 63. A high frequency current due to switching operations of the MOSFETs 81, 84 flows in a current pathway Ri that passes through the power-source voltage terminal 652, the power-source side conductor 552, the upper MOSFET 81, the copper clip 903, the motor side conductor 551, the lower MOSFET 84, the shunt resistor 991, the ground side conductor 553 and the ground terminal 653.

In the control terminals protruding from the second surface 63, the control terminal 481 is coupled with the gate of the upper MOSFET 81 via a wire, and the control terminal 484 is coupled with the gate of the lower MOSFET 84 via a wire. The switching operations of the MOSFETs 81, 84 are controlled by changing the gate voltages of the MOSFETs 81, 84 via the control terminals 481, 484. The control terminals 491, 494 are respectively coupled with two ends of the shunt resistor 991 and outputs voltage signals. Based on the voltage signals, the value of the electric current supplied to the U-phase winding can be detected.

A power module 60c according to a comparative example will be described with reference to FIG. 7. In FIG. 7, parts of the power module 60c, which are substantially same as the corresponding parts of the power module 60a, are assigned the same reference numerals as the corresponding parts, and descriptions of the parts will be omitted below. Furthermore, descriptions will be omitted about configurations of conductors corresponding to the MOSFETs 87, 88 for the power source relay and the like, which are not comparison points.

As shown in FIG. 7, the power module 60c according to the comparative example includes a power-source voltage terminal 122, a motor terminal 123, and a ground terminal 124 for the U-phase winding, a power-source voltage terminal 126, a motor terminal 125, and the ground terminal 124 for the V-phase winding, and the power-source voltage terminal 126, a motor terminal 127, and a ground terminal 128 for a W-phase. The terminals 122-128 are included in corresponding conductors 162-168.

The power module 60c uses the ground terminal 124 and the ground side conductor 164 for the U-phase winding and the V-phase winding and uses the power-source voltage terminal 126 and the power-source side conductor 166 for the V-phase winding and the W-phase winding. Thus, each of the motor terminals is inevitably disposed between the corresponding power-source voltage terminal and the corresponding ground terminal.

The power-source voltage terminal 122 extends from a center portion of a wide section 56 of the power-source side conductor 162 not from a portion of the wide section 56 closer to the ground side conductor 164. The power-source voltage terminal 126 extends from a center portion of a wide section 56 of the power-source side conductor 166 not from a portion of the wide section 56 closer to the ground side conductor 164 or the ground side conductor 168.

Next, effects of the power module 60a will be described below in contradistinction to the comparative example. In the following, effects in the semiconductor unit for the U-phase winding will be described on behalf of the semiconductor units for the three-phase winding. However, the semiconductor unit for the V-phase and the semiconductor unit for the W-phase have similar effects. In the comparative example, a pathway Ri from the power-source voltage terminal 122 to the ground terminal 124 is long and a loop area of a high frequency current is large. Thus, a radiation magnetic field is generated and a magnetic coupling with the power connector 79, which is coupled with the power substrate 70, is generated as shown by arrow MO in FIG. 7. As a result, a malfunction of the power module 60c may be caused and noises may flow to external devices.

According to the present embodiment, the first narrow section 57 extends from the portion of the first wide section 56 closer to the first side than the second side, and the power-source voltage terminal 652 is disposed adjacent to the ground terminal 653. Thus, a distance of the current pathway Ri from the power-source voltage terminal 652 to the ground terminal 653 can be short and a loop area of a high frequency current can be small. Thus, a generation of a radiation magnetic field by the high frequency current due to the switching operations of the MOSFETs 81, 84 can be restricted. As a result, as shown by arrow M1 in FIG. 4, a magnetic coupling with the power connector 79 and the like can be restricted, and a malfunction of the power module 60a and a flow of noises to external devices can be restricted.

According to the present embodiment, the motor side conductor 551 is disposed on the same side of the ground side conductor 553 as the power-source side conductor 552. Thus, the shunt resistor 992 is not a jump wiring. In the motor side conductor 551, the second narrow section 59 extends from the portion of the second wide section 58 closer to the second side than the first side. The motor terminal 651 extends in the first direction toward the first surface 62 in a manner similar to the power-source voltage terminal 652 and the ground terminal 653. The motor terminal 651, the power-source voltage terminal 652 and the ground terminal 653 are coupled with the one power substrate 70. Thus, a space is consolidated and workability can be improved.

According to the present embodiment, the copper clip 901 is used as the first connection conductor that couples the source of the higher MOSFET 81 and the motor side conductor 551. Thus, a cross-sectional area can be increased and a resistance of electric current can be reduced compared with a bonding wire. According to the present embodiment, the shunt resistor 991 is used as the second connection conductor that couples the source of the lower MOSFET 84 and the ground side conductor 553. Thus, the electric current supplied to the winding of the motor 2 can be detected.

Second Embodiment

A power module 60b according to a second embodiment of the present disclosure will be described with reference to FIG. 6. In the power module 60b according to the present embodiment, an arrangement of power-source side conductors and motor side conductors are different from the arrangement according to the first embodiment. Parts of the power module 60b, which are substantially same as the corresponding parts of the first embodiment, are assigned the same reference numerals as the first embodiment and descriptions of the parts will be omitted. Moreover, descriptions will be omitted about the configurations of the conductors corresponding to MOSFETs 87, 88 as the power supply relays and the like.

As shown in FIG. 6, the power module 60*b* according to the present embodiment includes a power-source voltage terminal 603, a motor terminal 604, and a ground terminal 605 for the U-phase winding, a power-source voltage terminal 608, a motor terminal 607, and a ground terminal for the V-phase winding, and a power-source voltage terminal 609, a motor terminal 610, and a ground terminal 611 for the W-phase winding. The terminals 603-609 are included in conductors 504-512, respectively. The conductors, the MOSFETs, the copper clips, and the shunt resistors form semiconductor units for three phases in a manner similar to the first embodiment. The semiconductor units for the three-phase winding have configurations similar to each other. The configuration of the semiconductor unit for the U-phase winding will be described below on behalf of the semiconductor units for the three-phase winding.

The power-source side conductor 504, the motor side conductor 505, and the ground side conductor 506 are disposed in this order from a side close to the power connector 79. The power-source side conductor 504 extends in the first direction. The power-source side conductor 504 includes a first wide section 56, the power-source voltage terminal 603, and the first narrow section 57 extending in the first direction from the first wide section 56 to the power-source voltage terminal 603. In the second direction that is perpendicular to the first direction, the first wide section 56 is wider than the first narrow section 57. The first wide section 56 has a first side and a second side opposite to the first side in the second direction. A distance between the first side of the first wide section 56 and the ground side conductor 506 is shorter than a distance between the second side of the first wide section 56 and the ground side conductor 506. The first narrow section 57 extends from a portion of the wide section 56 closer to the first side than the second side. The ground side conductor 506 has an approximately linear shape extending in the first direction in a manner similar to the ground side conductor 553 according to the first embodiment. The ground side conductor 506 includes the ground terminal 605 protruding from the first surface 62. The motor terminal 604 extending from the motor side conductor 505 toward the first surface 62 is disposed between the power-source voltage terminal 603 and the ground terminal 605.

According to the present embodiment, the motor terminal 604 is disposed between the power-source voltage terminal 603 and the ground terminal 605. Thus, a distance of a current pathway Ri from the power-source voltage terminal 603 to the ground terminal 605 is longer than the distance of the current pathway R1 of the first embodiment. However, the power module 60*b* is different from with the power module 60*c* according to the comparative example in that the power-source voltage terminal 603 and the first narrow section 57 extend from the portion of the first wide section 56 closer to the first side than the second side, and the distance between the first side of the first wide section 56 and the ground side conductor 506 is shorter than the distance between the second side of the first wide section 56 and the ground side conductor 506. Even through the motor terminal 604 is disposed between the power-source voltage terminal 603 and the ground terminal 605, a distance between the power source voltage terminal 603 and the ground terminal 605 can be decreased compared with the comparative example. Thus, the distance of the current pathway Ri can be short and the loop area of the high frequency current can be small. Therefore, the generation of the radiation magnetic field by the high frequency current due to the switching operations of the MOSFETs 81, 84 can be restricted.

Other Embodiments

In each of the power modules 60*a*, 60*b* according to the above-describe embodiments, the MOSFETs 87, 88 for the power source relay, the MOSFETs 81, 84 for the U-phase winding, the MOSFETs 82, 85 for the V-phase winding, the MOSFETs 83, 86 for the W-phase winding are arranged in this order from a side close to the power connector 79. The arrangement of the MOSFETs 81-88 may be changed. The power modules 60*a*, 60*b* do not always have to include the MOSFETs 87, 88 for the power source relay.

Each of the power modules 60*a*, 60*b* includes the three semiconductor units, each of which includes one higher MOSFET and one lower MOSFET, and is applied to the three-phase brushless motor. The number of semiconductor units is not limited to three. For example, when a power module is applied to a bridge circuit for driving a brushed motor, the power module may include two semiconductor units.

In each of the above-described embodiments, the MOSFETs are used as switching elements. However, a field-effect transistor other than MOSFET or an insulated gate bipolar transistor (IGBT) and the like may also be used as a switching element. When the IGBT is used as the switching element, an emitter corresponds to a drain equivalent electrode and a collector corresponds to a source equivalent electrode.

In each of the above-described embodiments, the source of the higher MOSFET and the motor side conductor is coupled via the copper clip. In another embodiment, the source of the higher MOSFET and the motor side conductor may also be coupled via a plurality of bonding wires so that electric resistances are similar to each other. In each of the above-described embodiments, the source of the lower MOSFET and the ground side conductor is coupled via the shunt resistor. In another embodiment, the source of the lower MOSFET and the ground side conductor may also be coupled via a bonding wire or a copper clip.

In each of the above-described embodiments, the power-source voltage terminals, which can operate as the high-potential side terminal, are supplied with the voltage of the power source 75 as a high potential source, and the ground terminals, which can operate as the low-potential side terminals, are coupled with the ground as a low potential source. In another embodiment, the high-potential terminal and the low-potential side terminal may also be coupled with a high potential source and a low potential source which are set other than the power source and the ground. The motor terminals (load side terminals) may also be disposed on an opposite side of the power module from the power-source voltage terminals (high-potential potential terminals) and the ground terminals (low-potential side terminals).

The driving apparatus 1 according to the above-described embodiments includes two substrates, that is, the control substrate 40 and the power substrate 70. In another embodiment, a driving apparatus may include one substrate. The extraction lines 23 and each of the power modules 60*a*, 60*b* may also be coupled, for example, by soldering, without via the power substrate 70. Each of the power modules 60*a*, 60*b* according to the above-described embodiments includes the metal heat radiation portions exposed from the molded member 61. In another embodiment, a power module may be a full-molded module without a metal heat radiation portion exposed from a molded member. In the present case, the heat radiation sheet 67 does not have to be made of insulation material.

The semiconductor modules according to the present disclosure may also be applied to various kinds of driving apparatus, not only to the driving apparatus 1 of the three-phase alternating motor for the electric power steering apparatus for the vehicle. While the present disclosure has been described with reference to the embodiments thereof, it is to be understood that the disclosure is not limited to the embodiments and constructions. The present disclosure is intended to cover various modification and equivalent arrangements.

What is claimed is:

1. A semiconductor module comprising:
   a plurality of switching elements that forms an inverter converting a direct current to an alternating current, the plurality of switching elements including a high-potential side switching element and a low-potential side switching element, the high-potential side switching element coupled to a higher potential side than the low-potential side switching element;
   a high-potential side conductor on which the high-potential side switching element is mounted, the high-potential side conductor extending in a first direction and including a high-potential side terminal coupled with a high potential source, the high-potential side conductor coupled with a drain or a drain equivalent electrode of the high-potential side switching element;
   a load side conductor on which the low-potential side switching element is mounted, the load side conductor including a load side terminal coupled with a load, the load side conductor coupled with a drain or a drain equivalent electrode of the low-potential side switching element;
   a low-potential side conductor extending in the first direction and including a low-potential side terminal coupled with a low potential source;
   a first connection conductor coupling a source or a source equivalent electrode of the high-potential side switching element and the load side conductor;
   a second connection conductor coupling a source or a source equivalent electrode of the low-potential side switching element and the low-potential side conductor;
   a molded member integrally covering the high-potential side switching element, the low-potential side switching element, the high-potential side conductor, the load side conductor, the low-potential side conductor, the first connection conductor, and the second connection conductor,
   wherein the high-potential side conductor further includes a wide section on which the high-potential side switching element is mounted and a narrow section extending from the wide section to the high-potential side terminal in the first direction,
   wherein the wide section is wider than the narrow section in a second direction perpendicular to the first direction,
   wherein the wide section has a first side and a second side opposite to the first side in the second direction,
   wherein a distance between the first side of the wide section and the low-potential side conductor is shorter than a distance between the second side of the wide section and the low-potential side conductor, and
   wherein the narrow section extends from a portion of the wide section closer to the first side than the second side.

2. The semiconductor module according to claim 1,
   wherein the narrow section of the high-potential side conductor is disposed adjacent to the low-potential side conductor.

3. The semiconductor module according to claim 2,
   wherein the load side conductor is disposed on the same side of the low-potential side conductor as the high-potential side conductor such that the load side conductor is disposed adjacent to the low-potential side conductor,
   wherein the load side conductor includes a wide section on which the low-potential side switching element is mounted and a narrow section extending from the wide section of the load side conductor to the load side terminal, and
   wherein the wide section of the load side conductor is wider than the narrow section.

4. The semiconductor module according to claim 1,
   wherein the load side conductor extends in the first direction.

5. The semiconductor module according to claim 1,
   wherein one of the first connection conductor and the second connection conductor includes a bonding wire.

6. The semiconductor module according to claim 1,
   wherein one of the first connection conductor and the second connection conductor includes a copper clip.

7. The semiconductor module according to claim 1,
   wherein one of the first connection conductor and the second connection conductor includes a shunt resistor.

8. The semiconductor module according to claim 1,
   wherein the high-potential side switching element, the low-potential side switching element, the high-potential side conductor, the load side conductor, the low-potential side conductor, the first connection conductor, and the second connection conductor form a semiconductor unit, and
   the semiconductor module further comprising one or more of the semiconductor units.

9. The semiconductor module according to claim 1, further comprising
   a plurality of control terminals to which control signals of the high-potential side switching element and the low-potential side switching element are input,
   wherein the plurality of control terminals is disposed in an opposite direction from the high-potential side terminal and the low-potential side terminal.

10. A driving apparatus comprising:
    a motor including a winding; and
    a control unit disposed on a side of the motor in an axial direction of the motor, the control unit including the semiconductor module according to claim 1, a heat sink on which the semiconductor module is mounted, and a substrate electrically coupled with the semiconductor module,
    wherein the semiconductor module is electrically coupled with the winding as the load, and
    wherein the heat sink is configured to receive heat generated in the semiconductor module.

* * * * *